Aug. 21, 1962 B. C. DE LOACH, JR 3,050,689

BROADBAND SOLID STATE AMPLIFIER AND SWITCH USING "DAM" CAVITY

Filed Dec. 12, 1960 2 Sheets-Sheet 1

INVENTOR
B. C. DeLOACH, JR.
BY
Sylvan Sherman
ATTORNEY

Aug. 21, 1962 B. C. DE LOACH, JR 3,050,689

BROADBAND SOLID STATE AMPLIFIER AND SWITCH USING "DAM" CAVITY

Filed Dec. 12, 1960 2 Sheets-Sheet 2

INVENTOR
B. C. DELOACH, JR.
BY Sylvan Sherman
ATTORNEY

United States Patent Office 3,050,689

Patented Aug. 21, 1962

3,050,689

BROADBAND SOLID STATE AMPLIFIER AND SWITCH USING "DAM" CAVITY

Bernard C. de Loach, Jr., Little Silver, N.J., assignor to Bell Telephone Laboratories, Incorporated, New York, N.Y., a corporation of New York Filed Dec. 12, 1960 Ser. No. 75,232
15 Claims. (Cl. 330—34)

This invention relates to solid state microwave devices and in particular to microwave amplifiers of the parametric and tunnel diode variety having increased gain-bandwidth characteristic and to high speed microwave switches.

Low noise amplification at microwave frequencies has, for many years, been exclusively achieved by means of vacuum tube amplifiers. Recently, however, solid state amplifiers have been developed which, in many respects, are superior to the prior art vacuum tube devices.

One class of solid state amplifier utilizes the nonlinear capacitance of a diode as the active element. In such an amplifier, the diode is suitably disposed within the wave path and, under proper conditions, converts energy from a high frequency pump signal to a suitably related lower frequency signal. The operation of this type of amplifier is described by E. D. Reed in an article entitled "The Variable-Capacitance Parametric Amplifier" published in the October 1959 Bell Laboratories Record, Vol. 37, No. 10, pp. 373–379. One of the limitations of this type of amplifier, however, is the relatively narrow bandwidth that has been achieved to date.

It is, therefore, an object of this invention to increase the bandwidth of the variable-capacitance type of parametric amplifier.

A study of a typical prior art amplifier has revealed that as a consequence of the technique utilized to mount the reactive diode in the amplifier structure, the variable capacitance introduced by the diode was incorporated into a high Q, series resonant circuit and was effectively in shunt with a fixed capacitance. A result of both of these limitations has been to produce an amplifier having a relatively poor gain-bandwidth characteristic.

It is, therefore, a more specific object of this invention to mount the reactive diode used in a parametric amplifier in an equivalent broadband circuit in which the full capacitance variation of the diode reacts upon the signal wave energy.

Another type of solid state amplifier employs a so-called "tunnel" or "Esaki" diode. This type of amplifier has also been found to be narrowband in its operation for similar reasons.

It is, accordingly, a further object of this invention to increase the bandwidth of the tunnel diode amplifier.

In accordance with the invention, a pair of conductive step discontinuities are introduced into the signal waveguide. These discontinuities form an obstruction, or dam, which extends across the entire width of the waveguide and reduces the height of the waveguide over a given longitudinal interval. It is noted that the change in guide height is accomplished instantaneously, or over a distance that is extremely small compared to the signal wavelength.

An active element, such as a variable-capacitance diode, is transversely mounted across the section of reduced height waveguide. In the preferred embodiment, the narrow dimensions of the reduced height region is such that only the crystal wafer and the crystal contacting element extend into the wave path. In such an arrangement, the active portion of the diode is effectively associated with a broadband circuit, i.e., a waveguide. Spurious series reactances and fixed shunt capacitances normally associated with prior art diode mounting arrangements are eliminated by recessing the crystal cartridge ends within the dam and within the waveguide wall. The capacity of the diode is then resonated by the choice of an appropriate length and height for the dam structure.

When utilized as a parametric or tunnel diode amplifier, the dam cavity, with some additional tuning elements for impedance matching and fine tuning, provides a very simple broadband amplifier structure. When the dam cavity is used in a parametric amplifier, pumping power is introduced into the reduced height waveguide by means of suitable coupling. While one signal port operation is possible, the use of two signal ports eliminates the need for a circulator to separate the incident and amplified signal for both types of amplifiers.

The dam structure described above has, in addition, separate utility as a high speed microwave switch. For example, by providing two port operation wave energy at the cavity resonant frequency propagates past the reduced height waveguide region. However, by changing the bias applied to the diode, thus detuning the circuit from its original resonant frequency, the coefficient of transmission is reduced and substantially all of the applied wave energy at the original resonant frequency is reflected by the cavity rather than transmitted. Because of the broadband characteristics of this type of device, the diode may be switched at an extremely high rate.

While the invention is described utilizing a variable-capacitance diode or a tunnel diode as the active element, it is obvious that other negative resistance devices may be used in conjunction with the dam cavity to produce broadband amplification or fast switching in the manner contemplated by the invention.

These and other objects and advantages, the nature of the present invention, and its various features, will appear more fully upon consideration of the various illustrative embodiments now to be described in detail in connection with the accompanying drawings in which.

Figures 1, 2:
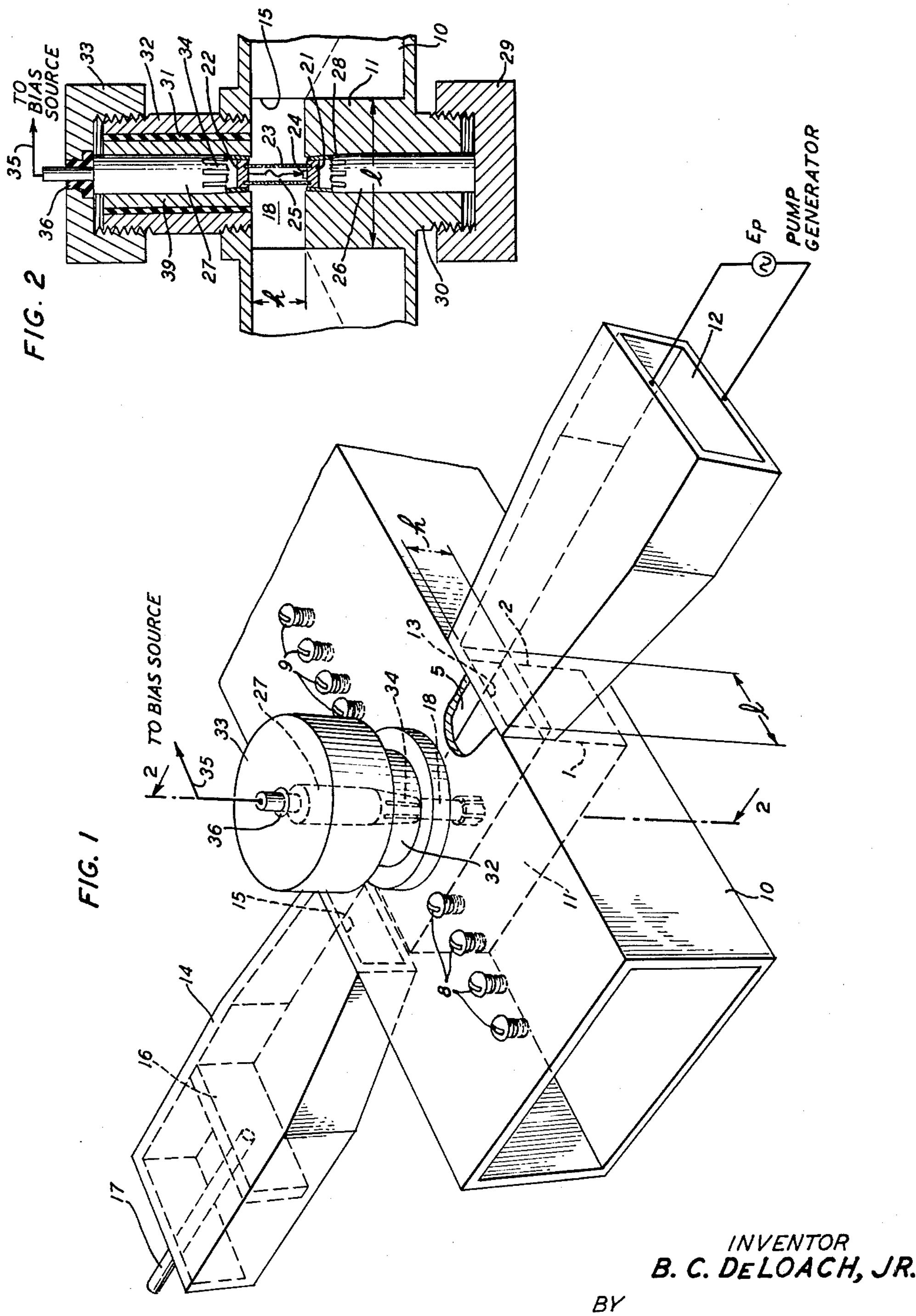
FIG. 1 is a perspective view of a first embodiment of the invention showing the dam and tapered sections of abutting waveguides.
FIG. 2 is a cross-sectional view showing details of the crystal diode and the diode supporting assembly.

Referring more specifically to FIG. 1, a variable-capacitance parametric amplifier is shown as an illustrative embodiment of the present invention. The amplifier comprises a section 10 of bounded electrical transmission line for guiding electromagnetic wave energy which may be a rectangular waveguide of the metallic shield type having a wide internal cross-sectional dimension of at least one-half wavelength of the wave energy to be supported therein and a narrow dimension substantially one-half of the wide dimension. So proportioned, this waveguide is supportive of wave energy in the dominant mode, known in the art as the $TE_{10}$ mode, in which the electric lines of force extend from the bottom to the top of the waveguide, perpendicular to the wide guide walls. Specifically, guide 10 is proportioned to support wave energy at the signal frequency in the dominant mode.

Extending transversely across the width of waveguide 10 are the pair of step discontinuities 1 and 2. As shown in FIG. 1, these discontinuities extend across the entire width of the guide and from the lower wide wall to within a distance $h$ of the upper wide wall. Because they partially obstruct the waveguide, the resulting obstruction 11 formed by them has been referred to as a "dam." The region directly above dam 11 comprises a section of reduced height waveguide 5. The choice of distance $h$ and of the longitudinal length $l$ of the section will be explained in greater detail hereinafter.

A second waveguide 12 abuts upon waveguide 10 over a region coextensive with the reduced height section of waveguide 5 with its transverse end connected to and terminating at one of the narrow walls. Waveguide 12 may also be a rectangular waveguide proportioned to support wave energy in the dominant mode at the pump frequency.

Coupling between waveguide 10 and waveguide 12 is through an aperture 13 cut in the narrow wall of guide 10 in the region directly above the dam. The aperture, as shown, has a rectangular cross section whose dimensions are substantially equal to $h$ and $l$.

Since the aperture dimensions are not, in general, equal to the internal transverse cross-sectional dimensions of guide 12, transitional means are provided to couple guide 12 to waveguide 10. In the illustrative embodiment of FIG. 1, guide 12 is tapered at its ends to match the dimensions of aperture 13. A similar arrangement is shown at the other narrow wall of guide 10, where a third waveguide 14, substantially identical to waveguide 12, couples to waveguide 10 through a second aperture 15. Guide 14 is terminated by a transverse shorting piston 16 whose longitudinal position along guide 14 can be changed by means of the control rod 17.

Coupling between the pumping wave energy introduced by waveguide 12 through aperture 13 and the signal wave propagating along guide 10 is effected by means of a common reactive element. In the embodiment of FIG. 1, this element is the voltage-sensitive capacitance diode 18, one end of which is conductively connected to the dam and the other end of which extends through an aperture in the upper wide wall of guide 10. The details of the diode assembly and its mounting are shown in FIG. 2 which is a section 2—2 taken through the diode cartridge.

The diode assembly 18, shown in detail in FIG. 2, is essentially the same as that described in United States Patent 2,956,160 issued on October 11, 1960, to W. M. Sharpless. It comprises a crystal cartridge having a pair of end members 21 and 22 spaced and supported by means of a cylindrical quartz sleeve 23. A crystal wafer 24, mounted on the center post of end 21, is contacted by a spring contact 25 which, in turn, is supported by the center post of end 22.

The crystal cartridge holder consists of a pair of silvered chucks 26 and 27. The lower chuck 26 extends up through a hole in the dam 11 and is conductively connected thereto along its length. The upper end of chuck 26 has a plurality of spring-like fingers 28 with which to hold one end of the crystal cartridge. The lower end of chuck 26 is protectively covered and held in position by means of a lock cap 29 which threads onto the threaded chuck guide 30.

The upper chuck assembly of the crystal cartridge holder comprises chuck 27, chuck holder 39, the insulating sleeve 31 and the threaded conductive sleeve 32. Chuck 27 extends through a hole in chuck holder 39 and is conductively connected thereto along its length. Chuck holder 39, in turn, is supported within sleeve 32 but conductively insulated therefrom by means of the insulating sleeve 31. Holder 39, conductive sleeve 32 and insulating sleeve 31 form, in addition, a low impedance bypass capacitor for high frequency currents.

Chuck 27 is protectively covered and held in position by a lock cap 33 which threads onto sleeve 32; the latter is threaded onto the upper wall of waveguide 10.

One end of chuck 27 has a plurality of spring-like fingers 34 with which to hold the other end of the crystal cartridge. The other end of chuck 27 extends through its lock cap and is conductively connected by means of a wire 35 to a source of biasing potential. An insulated bushing 36 conductively insulates chuck 27 from cap 33.

The height $h$ and the positions of chucks 26 and 27 are preferably adjusted so that neither end member 21 nor 22 extends into the wave path region between the upper guide wall and the top of the dam. So positioned, the only portion of the diode 18 which extends into the wave path is the crystal wafer 24 and a portion of its spring contact 25.

The length $l$ of the dam is proportioned to resonate the reduced height section of waveguide 5. The dam, it will be noted, introduces a capacitive susceptance and a conductance into the wave path at both of its ends. The portion 5 therebetween may then be regarded as a cavity region bounded by the pair of irises at either end. The cavity thus formed is called the "dam" cavity and is resonated at approximately half the pump frequency. A typical minimum-length resonant cavity has a physical length $l$ that is less than a quarter wavelength at the resonant frequency.

Figure 4:
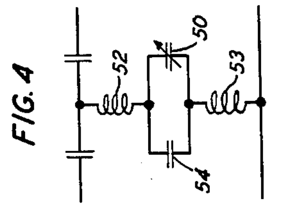
FIG. 4 is an approximate equivalent circuit of the diode mounting arrangement of FIG. 3.
Figure 3:
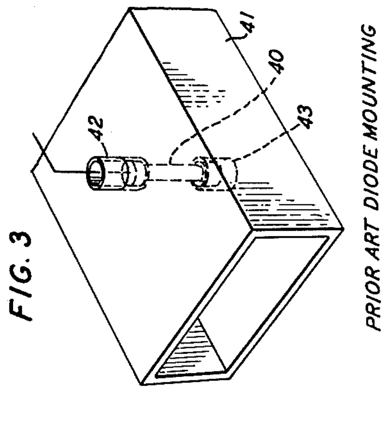
FIG. 3 is a perspective view of a typical prior art diode mounting arrangement.

As indicated earlier, a substantial increase in the gain-bandwidth product is obtained in a parametric amplifier built in accordance with the invention. This improvement comes about by virtue of two facts. First, the variable-capacitance diode is no longer associated with a spurious series resonant circuit as was characteristic of prior art amplifiers. Second, fixed, shunting capacitances as, for example, those associated with the crystal cartridge end members, have been effectively absorbed into the waveguide walls. These differences can be readily illustrated by considering a typical prior art amplifier wherein the diode was supported within the waveguide by means of cylindrical rods, or posts, as shown in FIG. 3. As there shown, diode 40 is supported in waveguide 41 by means of posts 42 and 43. An approximate equivalent circuit for this type of arrangement is shown in FIG. 4, wherein inductors 52 and 53 correspond to the equivalent inductances of posts 42 and 43, and capacitor 54 corresponds to the fixed capacitance between these posts. (The inductance of the diode spring contact has been neglected.) Variable capacitance 50, connected in parallel with capacitance 54 is the equivalent capacitance introduced by diode 40. Two things are apparent from an inspection of the equivalent circuit of FIG. 4. First, the diode 40 is associated with a spurious series resonant circuit. With practical dimensions this has been observed to be a high Q resonant circuit. As a consequence, the bandwidth of parametric amplifiers using this type of diode mounting have been unduly narrow. Second, it will be noted, the variable capacitance 50 introduced by the diode is effectively in parallel with a fixed capacitance 54 introduced by the posts 42 and 43 and the cartridge end caps. As a result, the gain-bandwidth product of such amplifiers is relatively small and the pumping power requirements are relatively high.

By contrast, by reducing the height of the waveguide in the manner disclosed herein, the mounting posts are eliminated and the diode cartridge end members are recessed within, and effectively absorbed into, the waveguide walls. As a result of these changes, the principal reactance introduced into the wave path is the equivalent diode capacitance which is effectively connected directly across the waveguide. Since the latter, when resonated by the dam discontinuities, is inherently a broadband circuit, the resulting amplifier tends to be broad band.

The improvements obtained may thus be summarized as follows. The replacement of posts 42 and 43 by the dam 11 substantially eliminates the series of inductances 52 and 53 leaving only the inductance of the spring contact which, in a well designed high frequency diode, may be neglected. The total recessing of the end members 21 and 22 within the reduced height waveguide walls essentially eliminates the shunt capacitance 54. Thus, the transition from posts to dam produces an improvement which is optimized by selecting a height for the reduced height portion of the waveguide which is most appropriate for the particular active element being employed.

The above-mentioned circuit improvements are equally applicable to other types of negative resistance devices as, for example, the tunnel or Esaki diode of the type described by Leo Esaki in an article entitled "New Phenomenon in Narrow Germanium p-n Junctions" published in the January 15, 1958, Physical Review No. 109, pp. 603–604. (Also see an article entitled "Tunnel Diodes" in the May 1960 Electrical Design News, page 50.) As with the parametric amplifier, one wishes to resonate the diode capacitance in a broadband circuit in order to obtain broadband amplification from the negative resistance associated with the tunnel diode. The reduced height, or dam cavity, shown in FIGS. 1 and 2 and described above provides such means. It should be noted, however, that because of its inherent negative resistance characteristic, no separate pumping wave is required by a tunnel diode amplifier.

The tuning procedure for a parametric amplifier of the type shown in FIG. 1 involves choosing a diode whose zero bias capacity is such that the dam cavity becomes a bandpass structure whose center frequency is approximately half the pump frequency. Pump power at frequency $f_p$ is then applied to waveguide 12 from generator $E_p$ in conjunction with the application of a negative bias to the diode, such that the signal circuit (that is, the dam cavity,) remains tuned to substantially the same frequency. Optimization of the amplifier gain-bandwidth characteristic is achieved by adjusting the bias applied to the diode 18 and by adjusting the tuning screws 8 and 9. Piston 16 is then adjusted to minimize the pumping power.

Because the pump frequency is approximately twice the signal frequency, the dimensions of waveguide 12 can be selected so that it is cut off for the signal frequency (and idler frequency). This effectively filters the signal (and idler) wave energy out of the pump circuit. However, because waveguide 10 is large enough to support wave energy at the pumping frequency, it is preferred that suitable filters (not shown) be placed on both sides of the dam to pass the signal (and idler) frequencies but reflect the pump frequency. The appropriate placement of such filters greatly enhances the utilization of the pump power.

Amplifiers of this type have produced 14.2 db gain with a 3.1 db double sideband noise figure. Bandwidths of over 1,000 mc. centered at a frequency of 11.3K mc./sec. were also obtained.

Aside from its use in amplifiers, a dam cavity makes an excellent high speed switch or electrically tunable bandpass filter. For example, if the dam cavity is resonated at the signal frequency under one set of diode bias conditions, the switch is effectively closed and wave energy at the signal frequency is transmitted. The coefficient of transmission at the signal frequency, however, can then be materially reduced by changing the diode biasing, thus detuning the dam cavity and thereby reflecting a substantial portion of the signal wave energy. Because of the broad frequency response of this type of circuit, the switching rate can be extremely high.

In the embodiment of FIGS. 1 and 2, the dam was shown extending from the bottom wide wall to within a distance $h$ of the upper wide wall. These is some advantage, however, in being able to vary the transverse location of the reduced height waveguide portion. Specifically, varying the position of the reduced height portion has the effect of tuning the dam cavity. This is particularly useful when used as a switch, since, in this situation, other tuning aids, such as screws 8 and 9, are generally not provided.

Figure 5:
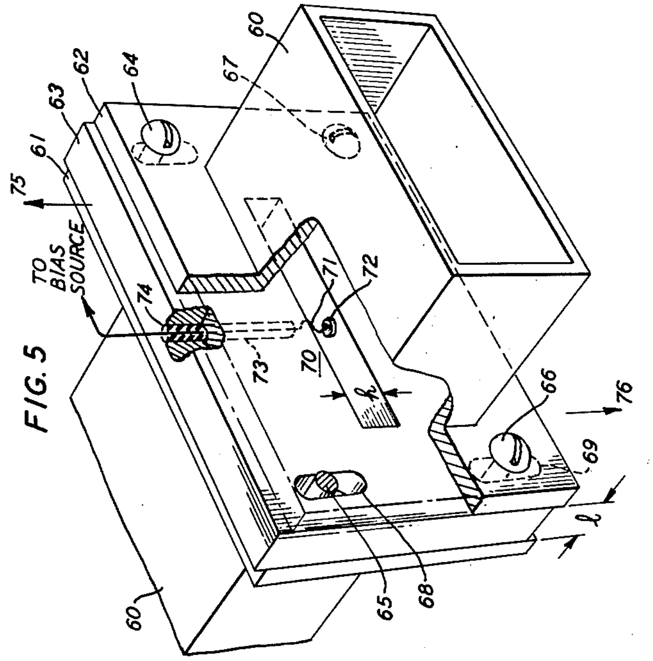
FIG. 5 is a perspective view of a second embodiment of the invention showing an adjustable dam cavity.

In FIG. 5, there is shown an arrangement for adjusting the position of the reduced guide portion. As there shown, the signal waveguide 60 is cut at at point along its length and flanges 61 and 62 attached to the two adjacent transverse ends of the guide. A slab-like member 63 is interposed between the two flanges 61 and 62 and secured thereto by means of screws 64, 65, 66 and 67. The flanges are drilled with circular screw holes to maintain a fixed relative position with respect to each other. However, member 63 is provided with oval holes, such as 68 and 69, to permit a degree of motion relative to guide 60.

The diode 70 is mounted directly within member 63, whose wide inside cross-sectional dimension is substantially the same as that of waveguide 60 and whose narrow inside dimension $h$ is selected so as to minimize the inductance introduced by the diode spring contact element 71.

Ideally, contact element 71 would have zero length and hence zero inductance. However, as the height $h$ of the reduced height portion of waveguide becomes smaller, the guide becomes lossy so that a minimum height is selected which represents a compromise between the contact inductance and the guide loss.

Crystal 72 is fastened directly to member 63 and its exposed surface contacted by the spring contact 71. The other end of contact 71 extends up through an aperture 73 in member 63 and connects to a source of bias potential. Contact 71 is supported within aperture 73 and conductively insulated from member 63 by means of a sleeve of dielectric material 74 which extends throughout aperture 73. The dielectric material 74 in conjunction with contact 71 and member 63 also serves as a high frequency bypass capacitor to confine high frequency currents to within the waveguide assembly.

By loosening screws 64, 65, 66 and 67, member 63 is free to move with respect to waveguide 60 in a direction parallel to the narrow wall of said guide as indicated by arrows 75 and 76, thereby varying the relative position of the reduced guide portion $h$ for tuning purposes.

Figure 6:
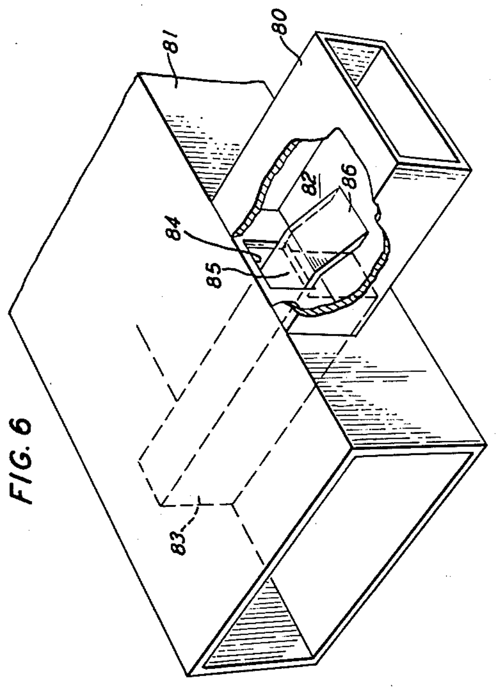
FIG. 6 is a perspective view showing an alternative means of coupling between the signal waveguide and the pump waveguide.

In FIG. 6, there is shown an alternate arrangement for coupling pump wave energy into the signal cavity. In the embodiment of FIG. 1, the ends of waveguides 12 and 14 are tapered to match the aperture dimensions $l$ and $h$. However, if dimension $l$ is sufficiently small compared to half a wavelength at the pump frequency, the end tapers may be cut off sections of waveguide over too great a length, thereby impairing the coupling of pump energy to the amplifier. In the embodiment of FIG. 6, the pump waveguide 80 abuts directly upon the narrow wall of signal waveguide 81, there being no tapering of the end. Instead, the upper surface 85 of the dam 83 is extended through aperture 84 in the form of a thin conductive tongue 82. The latter extends into guide 80 in a direction parallel to the wide walls of said guide for a distance and then gradually tapers down to, and terminates at the lower wide wall of guide 80, forming a ramp-like portion 86.

It should be noted that the pump wave energy as it exists along the dam is no longer in the dominant waveguide mode. Observations indicate that the dam structure appears as a strip transmission line to the pumping wave energy.

Figure 7:
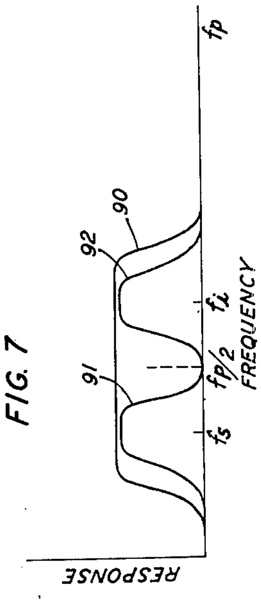
FIG. 7 is a graphical representation of the frequency response of an amplifier in accordance with the invention.

Because of the broad bandwidth of the dam-type parametric amplifier, two distinct modes of operation are possible. In the first mode, the signal frequency is precisely one-half of the pump frequency, and the idler and signal waves are merged. This is the so-called degenerate mode of operation. In the second, and generally more useful mode of operation, however, the signal frequency $f_s$ is different than one-half the pump frequency $f_p$. This gives rise to a separate and distinct idler frequency $f_i$, such that $f_i=f_p-f_s$. As is well known in the parametric amplifier art, provision must be made to support the idler wave energy and most prior art amplifiers had separate wave supporting circuits for the idler wave energy. However, because of the broad frequency response of the dam cavity amplifier, no separate idler circuit is required. This is illustrated in FIG. 7, which shows graphically the frequency characteristics of an amplifier in accordance with the invention. FIG. 7 shows the pumping frequency $f_p$, and the amplifier frequency response curve 90 centered at half the pump frequency $f_p/2$. However, because the amplifier is so broad band, a signal $f_s$ not equal to $f_p/2$ may be applied to the amplifier. This is indicated by the curve 91 centered at frequency $f_s$, where $f_s$ is less than $f_p/2$. The image frequencies are accordingly generated in a band centered about $f_i$, as shown by curve 92, where $f_i$ is greater than $f_p/2$. Both of the frequency bands, represented by curves 91 and 92, being well within the frequency capabilities of the amplifier, are amplified in the usual manner.

In the various illustrative embodiments described hereinabove, the negative impedance element (in the case of the amplifiers) and the switching element (in the case of the high speed switch) have been characterized as diodes having particular properties appropriate for their purpose. It is quite obvious, however, that the teachings of this invention may be extended to include other types of active elements. In such cases the height $h$ of the reduced height portion of the waveguide would be adjusted to accommodate such alternate elements. That is, the height $h$ would be such as to incorporate within the guide those portions of such elements whose presence would produce spurious resonances or would otherwise tend to dilute the principal effect intended to be produced by such an element and thereby reduce the overall effectiveness of the device.

It is, accordingly, understood that the above-described arrangements are merely illustrative of a small number of the many possible specific embodiments which can represent applications of the principles of the invention. Numerous and varied other arrangements can readily be devised in accordance with these principles by those skilled in the art without departing from the spirit and scope of the invention.

What is claimed is:

1. A parametric amplifier comprising a rectangular waveguide the narrow dimension of which is abruptly reduced in step-like fashion over a given longitudinal length to define a section of reduced height waveguide, a variable-capacitance diode extending transversely across said section in a direction parallel to the narrow dimension thereof, said section forming a cavity whose dimensions are proportioned to resonate said diode at a predetermined frequency, and means for coupling wave energy into said section through one of the narrow walls of said section at twice said frequency.

2. The combinaton according to claim 1 wherein the means for reducing the narrow dimension of said waveguide comprises a conductive discontinuity extending transversely across the full width of said waveguide.

3. The combination according to claim 1 wherein said section of reduced height waveguide has a height $h$ and a longitudinal length $l$ and wherein said coupling means comprises a rectangular aperture whose cross-sectional dimensions are substantially equal to $h$ and $l$.

4. A microwave amplifier comprising a section of waveguide of rectangular cross section having a pair of wide and a pair of narrow conductive walls, means for reducing the height of said waveguide over a given longitudinal interval comprising a pair of conductive discontinuities extending transversely across the width of said guide and extending from one of said wide walls in a direction normal thereto to within a distance $h$ of the other of said wide walls, means for introducing within said given interval an impedance having a negative resistance component where said distance and said interval are selected to resonate said impedance at a predetermined frequency producing a given frequency response characteristic for said amplifier, and means for energizing said waveguide at a second frequency within said given frequency response.

5. The combination according to claim 4 wherein said impedance is a tunnel diode.

6. A high speed microwave switch comprising a pair of longitudinally spaced, conductively bounded rectangular waveguides having a pair of wide and a pair of narrow walls of substantially similar dimensions, a third rectangular waveguide having a wide dimension substantially the same as the wide dimension of said pair of waveguides and a narrow dimension substantially smaller than said narrow dimension of said waveguides, said third waveguide being received between adjacent ends of said pair of waveguides and being adjustable in a transverse direction parallel to the narrow walls thereof, an electrically biased variable-capacitance diode transversely supported within said third waveguide in a direction parallel to said narrow walls, said third waveguide forming a cavity whose dimensions are proportioned to resonate said diode at a predetermined frequency, and means for varying the bias applied to said diode.

7. A combination according to claim 6 wherein said diode comprises a crystal element supported upon one of the wide walls of said third waveguide and having a point contacting member extending perpendicular to said wide wall to contact an exposed surface of said crystal.

8. A combination according to claim 6 wherein the transverse position of said third waveguide can be adjusted relative to said pair of waveguides in a direction parallel to its narrow walls and wherein said adjustment tends to tune said cavity.

9. A parametric amplifier comprising three sections of rectangular waveguide, said sections having substantially the same wide internal cross-sectional dimensions, two of said sections having the same narrow internal cross-sectional dimensions with the third of said sections having a narrow internal cross-sectional dimension substantially smaller than that of the other of said two sections, said sections arranged in longitudinal succession with their narrow walls aligned and with said third section disposed between the other of said two sections, fourth and fifth sections of rectangular waveguide having their transverse ends abutting upon opposite narrow walls respectively of said waveguides over a region thereof coextensive with said third section, means for electromagnetically coupling said fourth and fifth sections to said third section, and an electrically biased variable-capacitance diode transversely disposed across said third section in a direction parallel to said narrow walls.

10. A combination according to claim 9 wherein said diode is located midway between the narrow walls of said third section and midway between said two sections.

11. The combination according to claim 9 wherein said coupling means comprises a pair of apertures extending through opposite narrow walls of said third section of waveguide and a conductive vane extending from each of said apertures a distance into the adjacent section of an abutting waveguide in a direction parallel to the walls thereof and then inclining at an angle thereto and terminating along a wide wall of the abutting waveguide.

12. The combination according to claim 9 wherein said coupling means comprises a pair of apertures extending through opposite narrow walls of said third section of waveguide and wherein the cross-sectional dimensions of said fourth and fifth sections of waveguide gradually taper from a first cross section at a distance from said transverse ends to a second cross section at their respective abutting transverse ends.

13. A parametric amplifier comprising a rectangular waveguide whose narrow dimension is abruptly reduced in step-like fashion over a given longitudinal length to define a section of reduced height waveguide, a variable-capacitance diode extending transversely across said section in a direction parallel to the narrow dimension thereof, said section forming a cavity whose dimensions are proportioned to resonate said diode at a predetermined frequency $f_1$ producing a given frequency response characteristic for said amplifier which extends from a first frequency below $f_1$ to a second frequency above $f_1$, means for coupling pumping wave energy into said section through one of the narrow walls of said section at a frequency higher than said second frequency, and means for energizing said cavity at a signal frequency $f_s$ within said given frequency response.

14. The combination according to claim 13 wherein said signal frequency is equal to one-half said pumping frequency.

15. The combination according to claim 13 wherein said signal frequency is different than one-half said pumping frequency and wherein the difference between said pumping frequency and said signal frequency also falls within said frequency response characteristic.

References Cited in the file of this patent

UNITED STATES PATENTS

| | | |
|---|---|---|
| 2,806,138 | Hopper | Sept. 10, 1957 |
| 2,928,056 | Lampert | Mar. 8, 1960 |
| 2,970,275 | Kurzrok | Jan. 31, 1961 |

FOREIGN PATENTS

| | | |
|---|---|---|
| 144,179 | Australia | Nov. 12, 1960 |